United States Patent [19]
Fujitsu

[11] Patent Number: 5,556,810
[45] Date of Patent: Sep. 17, 1996

[54] METHOD FOR MANUFACTURING A SEMICONDUCTOR DEVICE WHEREIN A SEMICONDUCTOR CHIP IS CONNECTED TO A LEAD FRAME BY METAL PLATING

[75] Inventor: Takao Fujitsu, Yokohama, Japan

[73] Assignee: Kabushiki Kaisha Toshiba, Kawasaki, Japan

[21] Appl. No.: 461,448

[22] Filed: Jun. 5, 1995

Related U.S. Application Data

[62] Division of Ser. No. 344,605, Nov. 18, 1994, which is a continuation of Ser. No. 77,317, Jun. 15, 1993, abandoned, which is a continuation of Ser. No. 707,763, May 30, 1991, abandoned.

[30] Foreign Application Priority Data

Jun. 1, 1990 [JP] Japan ..................... 2-141684

[51] Int. Cl.⁶ ................................. H01L 21/60
[52] U.S. Cl. ................. 437/209; 437/211; 437/214; 437/217; 437/219
[58] Field of Search ..................... 437/209, 211, 437/214, 217, 219, 220, 206, 183, 189, 192

[56] References Cited

U.S. PATENT DOCUMENTS

| | | | |
|---|---|---|---|
| 4,143,618 | 3/1979 | Del Vecchio | 118/603 |
| 4,176,443 | 12/1979 | Iannuzzi et al. | 357/71 |
| 4,205,099 | 5/1980 | Jones et al. | 437/183 |
| 4,280,132 | 7/1981 | Hayakawa et al. | 357/70 |
| 4,406,248 | 9/1983 | Araki et al. | 118/690 |
| 4,496,965 | 1/1985 | Orcutt et al. | 357/70 |
| 4,626,960 | 12/1986 | Hamano et al. | 357/80 |
| 4,824,803 | 4/1989 | Us et al. | 437/192 |
| 4,839,713 | 6/1989 | Teraoka et al. | 357/70 |
| 4,885,630 | 12/1989 | Temple | 357/71 |
| 4,922,322 | 5/1990 | Mathew | 357/71 |
| 4,933,049 | 6/1990 | Murphy et al. | 205/88 |
| 4,948,645 | 8/1990 | Holzinger et al. | 357/70 |
| 4,977,441 | 12/1990 | Ohtani et al. | 357/70 |
| 5,016,082 | 5/1991 | Roth | 357/70 |
| 5,019,209 | 5/1991 | Hiraide et al. | 156/680 |
| 5,066,614 | 11/1991 | Dunaway et al. | 437/209 |
| 5,260,234 | 11/1993 | Long | 437/220 |

FOREIGN PATENT DOCUMENTS

| | | |
|---|---|---|
| 55-24479 | 2/1980 | Japan . |
| 57-143848 | 9/1982 | Japan . |
| 57-50056 | 10/1982 | Japan . |
| 61-208245 | 3/1985 | Japan . |
| 60-092636 | 5/1985 | Japan . |
| 62-108534 | 6/1985 | Japan . |
| 62-208642 | 9/1987 | Japan . |
| 62-296431 | 12/1987 | Japan . |
| 1-276750 | 4/1988 | Japan . |
| 63-073644 | 4/1988 | Japan . |
| 2-87538 | 9/1988 | Japan . |
| 64-19752 | 1/1989 | Japan . |
| 64-73734 | 3/1989 | Japan . |
| 1-207938 | 8/1989 | Japan . |
| 2-033929 | 2/1990 | Japan . |
| 2-66953 | 3/1990 | Japan . |
| 2-119252 | 5/1990 | Japan . |
| 2-121359 | 5/1990 | Japan . |
| 2-208957 | 8/1990 | Japan . |

*Primary Examiner*—Kevin M. Picardat
*Attorney, Agent, or Firm*—Finnegan, Henderson, Farabow, Garrett & Dunner, L.L.P.

[57] ABSTRACT

A plurality of electrode pads are formed on a main surface of a semiconductor chip. The electrode pads on the semiconductor chip are electrically connected to the top end of an inner lead through a metal plating layer.

15 Claims, 5 Drawing Sheets

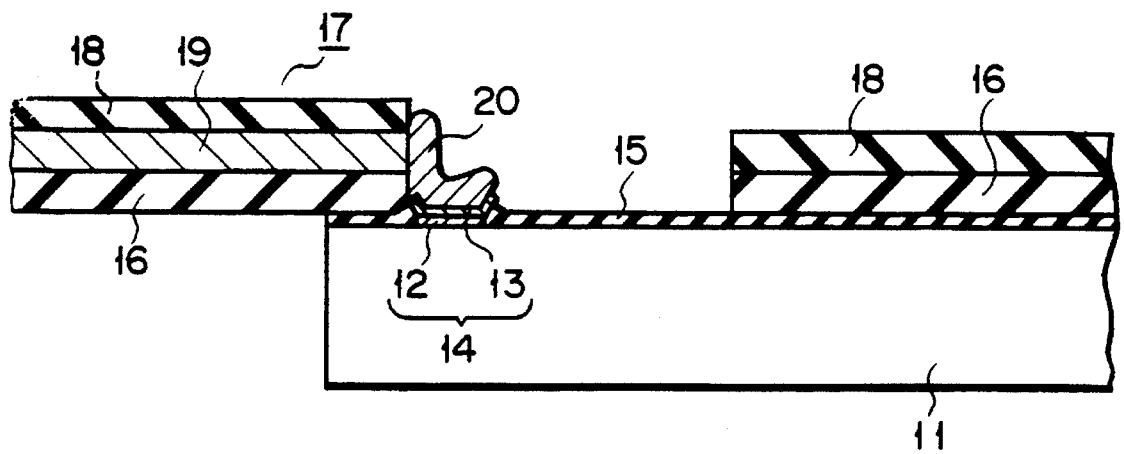
F I G. 1
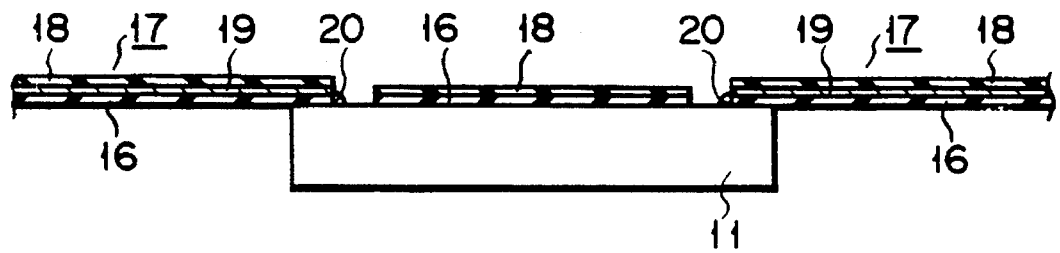
F I G. 2
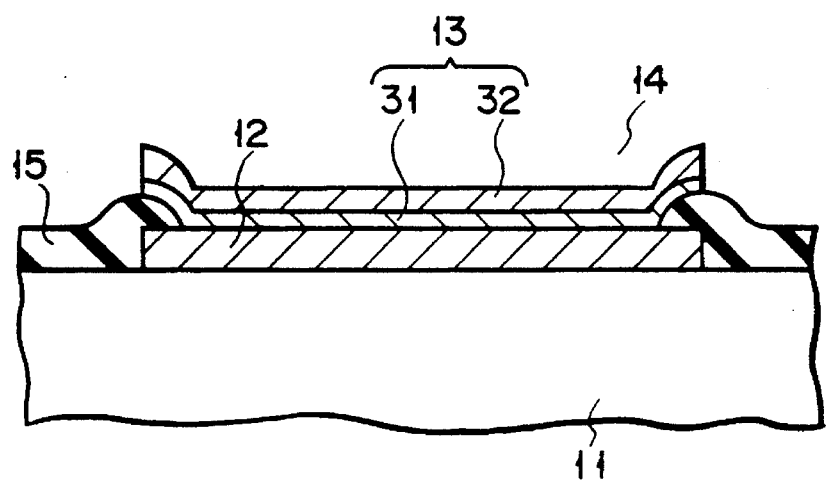
F I G. 3

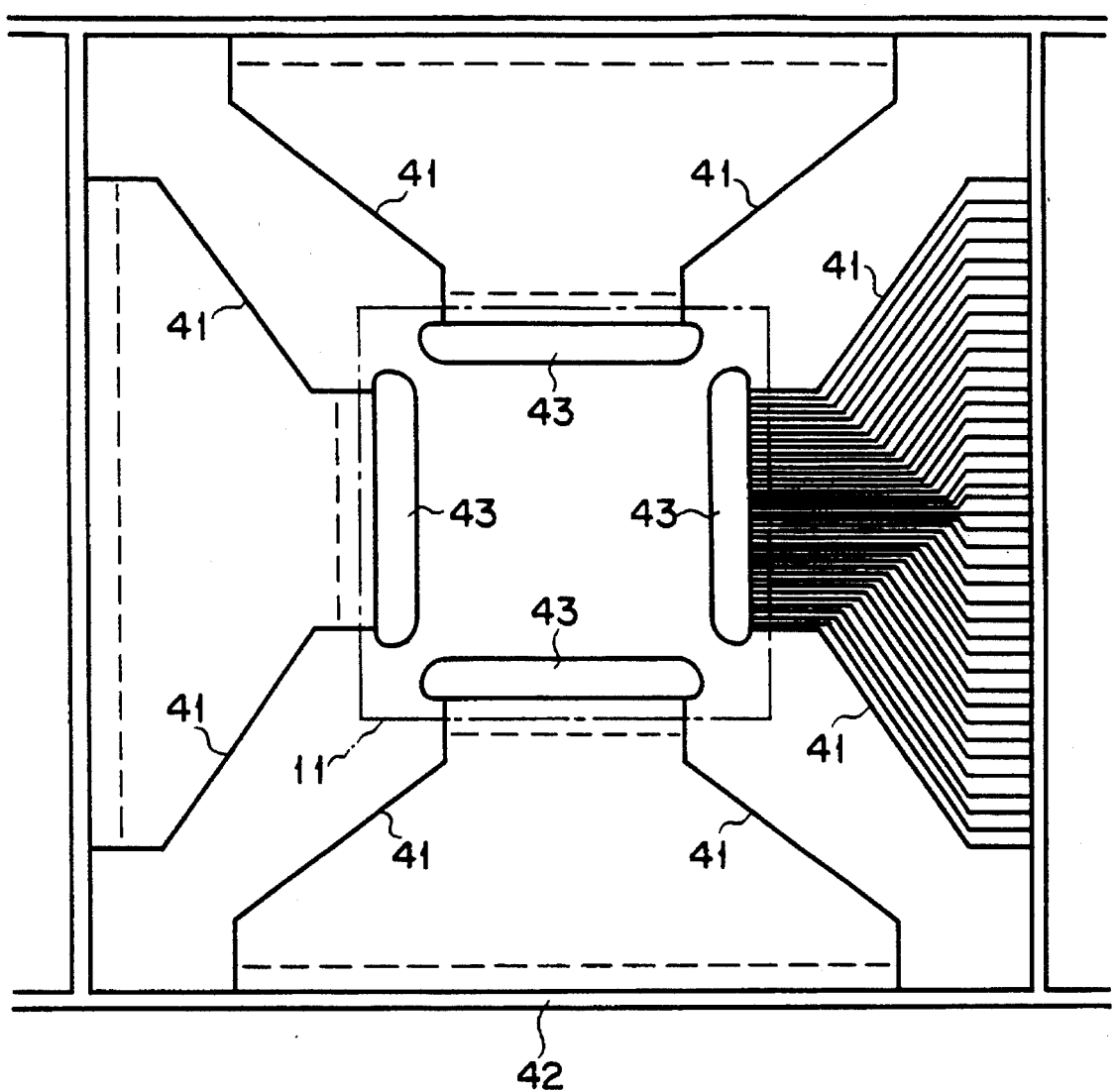
F I G. 6

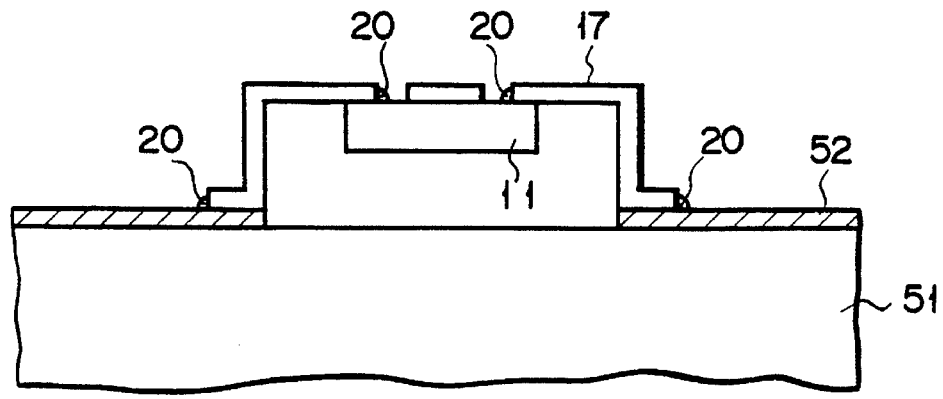
F I G. 9
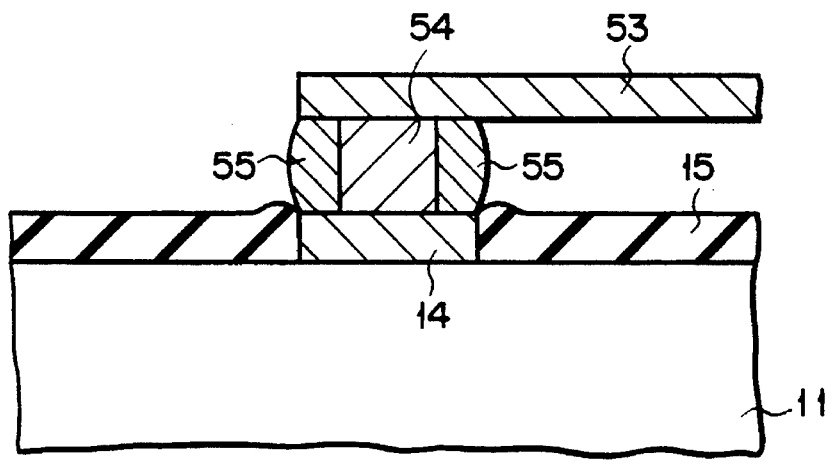
F I G. 10
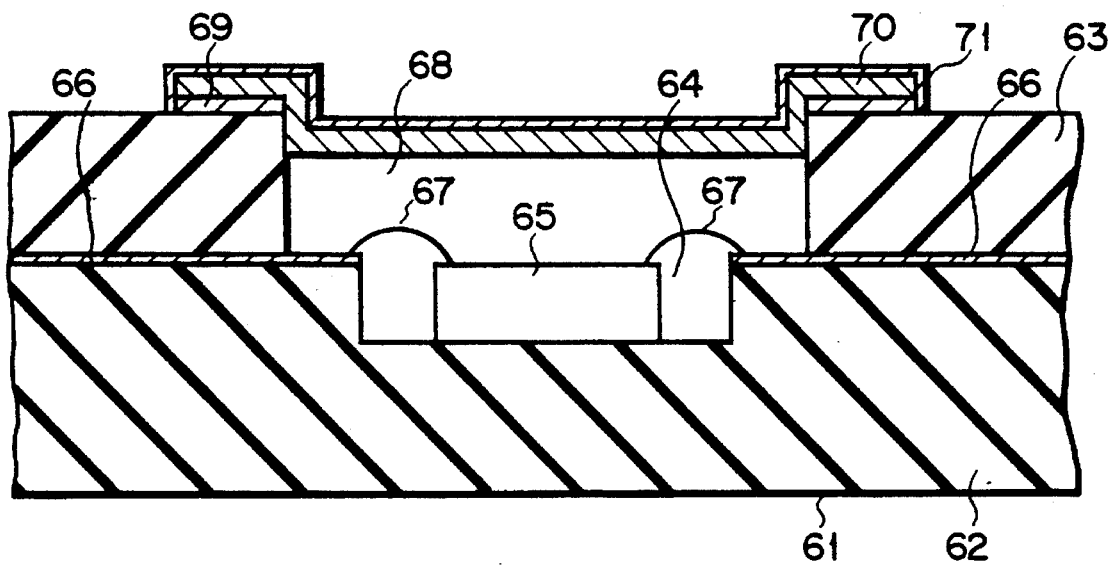
F I G. 11

METHOD FOR MANUFACTURING A SEMICONDUCTOR DEVICE WHEREIN A SEMICONDUCTOR CHIP IS CONNECTED TO A LEAD FRAME BY METAL PLATING

This is a division of application Ser. No. 08/344,605, filed Nov. 18, 1994, which is a continuation application of U.S. patent application Ser. No. 08/077,317 filed Jun. 15, 1993, now abandoned, which is a continuation of U.S. patent application Ser. No. 07/707,763 filed May 30, 1991, now abandoned.

BACKGROUND OF THE INVENTION

1. Field of the Invention

The present invention relates to a semiconductor device, in which an electrical connection between electrodes on a semiconductor chip and inner leads of a lead frame is provided and an electrical connection between outer leads of the lead frame and wiring patterns on a print circuit board is provided, and its manufacturing method, and more particularly to a semiconductor device wherein a distance between electrodes on the semiconductor chip to provide the electrical connection and a distance between the inner leads of the lead frame and a distance between the outer leads thereof are minute, and its manufacturing method.

2. Description of the Related Art

When the semiconductor device is manufactured, there are numerous portions where an electrical connection is to be provided such as a portion between an electrical pad on a semiconductor chip and an inner lead of a lead frame, and a portion between an outer lead of the lead frame and a wiring pattern on a print circuit board.

Conventionally, for example, the electrical connection between the electrode pad on the semiconductor chip and the inner lead is made by a metal bonding such as a wire bonding using AU wire or A wire, a TAB (Tape Automated Bonding) method, an ohmic contact such as a metal contact between a bump electrode on a flip chip and a lead, and the like.

Regarding the connection by the wiring bonding, the shortest distance between adjacent wires is restricted by the outer shape of a bonding capillary to be used. Due to this, it is difficult to reduce the distance between the pads on the semiconductor chip to be about 100 μm.

Moreover, in order to connect an Au ball or an A wire to an aluminum pad on the semiconductor chip, it is necessary to apply a physical load such as heating, pressing, ultrasonic vibration. Therefore, damage is often applied to the semiconductor chip itself under the electrode pad.

In a case where TAB system or the flip chip is used, it is necessary to metal-connect Au bump or plating bump to the inner lead. Due to this, the temperature of the above case often increases higher than that of the wire bonding connection, so that a physical damage due to pressure remains. In this case, the distance between the pads can be reduced to about 80 μm, however, there is a limitation in the reduction of the bump size because of the use of the metal connection. Moreover, a large number of portions are connected at the same time. Due to this, as the number of portions to be connected is increased more, it is more difficult to obtain a stable connection in view of the height of the bump, and the condition of the connection. Due to this, it is required that the process conditions be stabilized.

The above-mentioned problem occurs in not only the electrical connection between the pad on the semiconductor chip or the bump and the inner lead but also the electrical connection between the outer lead and the wiring pattern on the print circuit board.

SUMMARY OF THE INVENTION

An object of the present invention is to provide a semiconductor device, in which the distances between portions to be electrically connected can be reduced more than the conventional case and high reliance can be obtained without applying physical damages due to heating, pressurizing when the electrical connection is made, and its manufacturing method.

According to the present invention, there is provided a semiconductor device comprising a lead frame formed of a conductive material, a semiconductor chip having a plurality of electrodes on its surface, and a connect section where the lead frame is electrically connected to the plurality of electrodes on the semiconductor chip by a metal plating.

Moreover, according to the present invention, there is provided a semiconductor device comprising an insulating film, a wiring pattern formed on the insulating film, a semiconductor chip having a plurality of electrodes on its surface, and a connect section where the end surface of the wiring pattern is electrically connected to the plurality of electrodes on the semiconductor chip by a metal plating.

Furthermore, according to the present invention, there is provided a semiconductor device comprising a lead frame to which a semiconductor chip is connected, a wiring board having a wiring pattern on its surface, and a connect section where the lead frame is electrically connected to the wiring pattern on the wiring substrate by a metal plating.

Furthermore, according to the present invention, there is provided a semiconductor device comprising a lead frame formed of a conductive material, a semiconductor chip having an electrode on its surface, a first connect section where the lead frame is electrically connected to an electrode on the semiconductor chip by a conductive adhesive, and a second connect section where the lead frame is electrically connected to the electrode on the semiconductor chip by a metal plating to cover the surroundings of the first connect section.

Also, according to the present invention, there is provided a manufacturing method of a semiconductor device comprising the steps of moving a lead frame formed of a conductive material and an electrode formed on a surface of a semiconductor chip to be close to each other and adhering the semiconductor chip to the lead frame, and immersing the lead frame and the semiconductor chip in an electrolytic plating solution and forming a metal plating layer where the lead frame is electrically connected to the electrode on the semiconductor chip.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a cross sectional view showing the structure of a part of a device of a first embodiment of the present invention;

FIG. 2 is a cross sectional view showing a general structure of the device of the first embodiment of the present invention;

FIG. 3 is a cross sectional view showing a specific structure of an electrode pad of the device of the first embodiment of the present invention;

FIGS. 5 and 6 are plane views of a TAP tape, which is used in the device of the first embodiment of the present invention, respectively;

FIG. 9 is a cross sectional view showing a device of a second embodiment of the present invention;

FIG. 10 is a cross sectional view showing a device of a third embodiment of the present invention; and FIG. 11 is a cross sectional view showing a device of a fourth embodiment of the present invention.

DETAILED DESCRIPTION OF THE PREFERRED EMBODIMENTS

Figure 4:
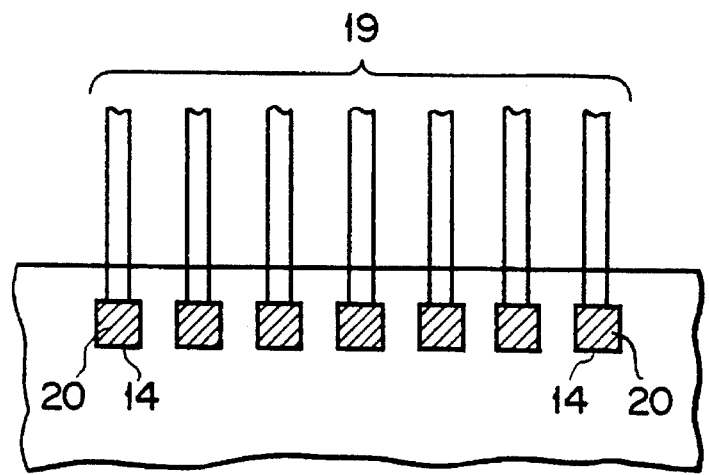
FIG. 4 is a plane view showing a state of the connection between a plurality of electrode pads of the device of the first embodiment and a plurality of inner leads.

The embodiments of the present invention will be explained with reference to the drawings.

FIG. 1 shows the structure of a part of a semiconductor device of a first embodiment of the present invention wherein the present invention is used in the connection between a plurality of electrode pads on a semiconductor chip and a plurality of inner leads, and FIG. 2 is the general structure thereof.

In the drawings, reference numeral 11 is a semiconductor chip wherein an active element such as a transistor and a passive element such as a resistor and a capacity. Around the main surface of the semiconductor chip 11, there are formed a plurality of electrode pads 14, which is formed of a first metal layer 12 whose lower layer is formed of aluminum (Al) and a second metal layer 13 whose upper layer includes at least one nickel layer. These electrode pads 14 are arranged in line with a predetermined distance. The portions of the semiconductor chip 11 other than the electrode pad formation position are covered with an insulating surface protection film 15 such as a silicon oxidation film. The semiconductor chip 11 is adhered to a predetermined portion of a TAB tape 17 by an epoxy adhesive 16.

As shown in FIG. 1, the TAB tape 17 is made of epoxy or polyimide resin. Metal foil such as copper (Cu) foil having a thickness of about 35 μm is laminated on an organic film material 18 having a thickness of about 75 μm. Thereafter, there is formed a wiring pattern comprising a plurality of inner leads 19 to be connected to the plurality of electrode pads 14 by a selection etching technique and outer leads electrically connected to these inner leads (not shown). The wiring pattern forming surface is adhered to the semiconductor chip 11 by the adhesive 16.

When the semiconductor chip 11 is adhered to the TAB tape 17, the positioning is performed in a state that each electrode pad 14 is positioned close to the portion where each end surface of the end portions of the plurality of inner leads 19 is exposed. Then, each electrode pad 14 on the semiconductor chip 11 and each end portion of the inner lead 19 are electrically connected through a metal plating layer 20 formed of nickel (Ni).

FIG. 3 shows the specific structure of each electrode pad 14. In this embodiment, the second metal layer 13 formed on the first metal layer 12 made of aluminum (Al) comprises at least two metal layers. More specifically, the lower layer contacting the first metal layer made of aluminum is formed of a titan (Ti) layer 31 having a thickness of 1000 Å, and the upper layer is formed of the nickel (Ni) layer 32 having a thickness of 3000 Å. The nickel layer 32, which is the upper layer of the second metal layer 13 is formed to allow the metal plating layer 20 made of nickel to be formed on the electrode pad 14. Also, the titan layer 31, which is the lower layer of the second metal layer 13, has a function as barrier metal.

FIG. 4 shows a state of the connection between the plurality of electrode pads 14 and the plurality of inner leads 19 formed on the TAB tape 17. In the drawing, a region in which slant lines are added shows the metal plating layer 20.

In the above embodiment, each electrode pad 14 on the semiconductor chip 11 and each inner lead 19 are connected by the metal plating layer 20. Due to this, bonding capillary and TAB tool, which are used to the wire bonding and TAB connection are not required. Thereby, the distance between electrode pads 14 can be reduced to 100 μm or less, for example, about 50 μm.

Moreover, if each electrode pad 14 and each inner lead 19 are electrically connected, no physical pressure is applied to the semiconductor chip 11, so that reliance due to pressure damage is not lowered. Then, since a large number of portions can be connected at the same time under the same condition, reliance of connection can be improved. Moreover, since there is no need of heating when the connection is performed, it is possible to prevent reliance from being lowered by thermal stress, which is caused by a mismatch of the coefficient of thermal expansion of each semiconductor layer in the semiconductor chip.

A method of forming the above metal plating layer where the electrode pads and the inner leads are electrically connected will be explained.

Figure 5:
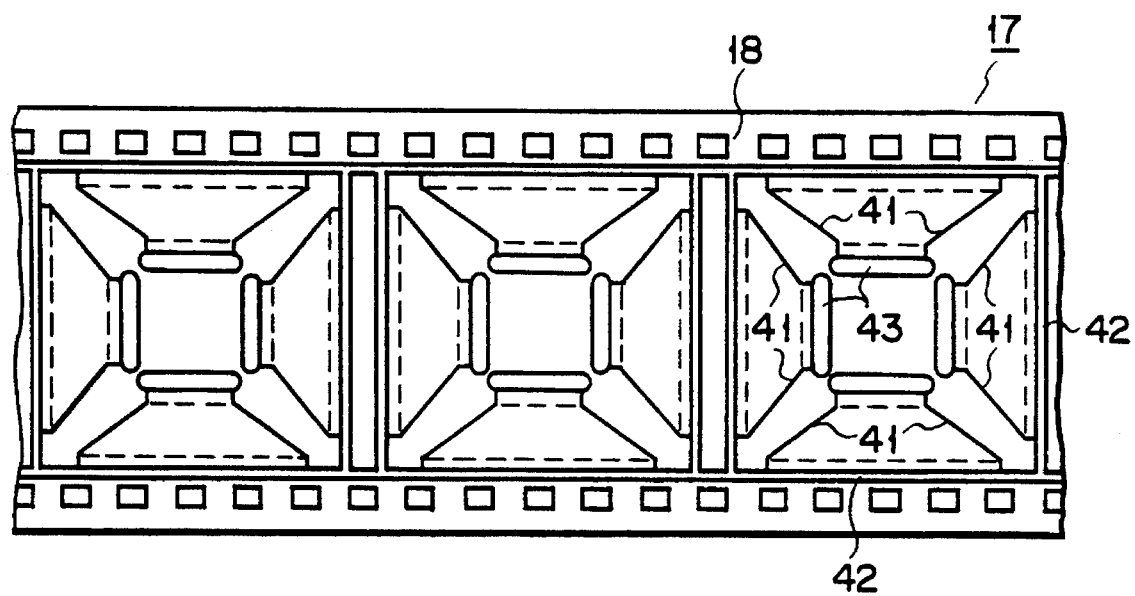

In TAB tape, as shown in FIG. 5, metal foil such copper foil is laminated on the organic film material 18 in advance. Thereafter, in every semiconductor device, there are formed a plurality of lead electrodes 41 comprising the inner leads and the outer leads connected to the inner leads by the selection etching technique. At the same time when the selection etching is performed, common electrodes 42, which are electrically connected to the lead electrodes 41, are formed around each semiconductor device in a state that all common electrodes 42 are connected. Additionally, in FIG. 5, reference numeral 43 is an opening formed in the organic film material 18.

FIG. 6 shows an enlarged one semiconductor device in the TAB tape of FIG. 5 In the drawing, the semiconductor chip is adhered to TAB tape in a state that the semiconductor chip is positioned in the area shown by a one dotted chine line. In this case, the semiconductor chip is adhered to TAB tape so that the pad of each electrode on the semiconductor chip is positioned close to the portion where each end of the end portion of the plurality of leads is exposed.

Thereafter, TAB tape is immersed in nickel plating bath together with a plating electrode. The nickel plating bath is generally called a watt bath, and nickel sulfate, nickel chloride, and adhesive are used. After TAB tape and the plating electrode are immersed in the watt bath, a predetermined direct voltage is applied between the common electrode 42 and the plating electrode in order that the common electrode 42 serves as a positive side and the plating electrode serves as a negative side, and electrolytic plating is performed for a predetermined period of time. For example, a direct voltage to be applied was set to 2 v, a current to be supplied between the positive and negative sides was set to 60 mA, and plating time was set to 10 minutes. As a result, a nickel plating layer having a thickness of 10 μm was obtained as metal plating layer 20. The metal plating layer grows from each end surface of the top end portion of the inner lead immediately after plating starts. Then, if the growth advances and the plating layer contacts the electrode pad on the semiconductor chip, the metal layer also grows in the electrode pad, and both the common electrode 42 and the plating electrode are finally electrically connected by the plating layer. After the end of plating, the plating layer is washed with pure water, and contaminant, which was adhered to the surface when plating, is removed. Additionally, in the surface of each lead electrode 41, which comprises the inner and outer leads, the most of the surface other than the top end portion of the inner lead is coated with an epoxy insulating film, which is called green coat. Thereby, it is possible to form the plating layer in only the necessary portion. Due to this, plating time can be shortened.

Various modifications of the first embodiment will be explained.

Figure 7:
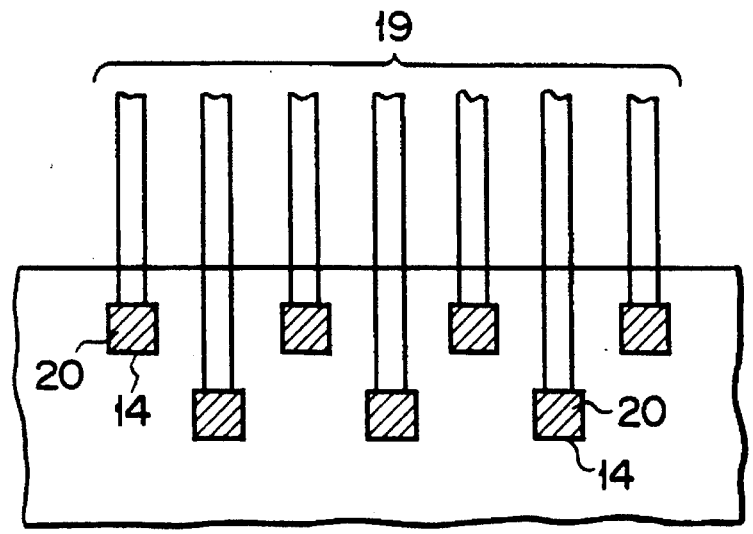
FIGS. 7 and 8 are plane views of modifications of the device of the first embodiment of the present invention, respectively.

The above embodiment explained that the electrode pads were arranged in line with a predetermined distance. In the modified device of FIG. 7, the electrode pads 14 are arranged on the semiconductor chip in a zig-zag manner. The same reference numerals as FIG. 4 are added in the portions corresponding to the portions of FIG. 4, and the explanation thereof is omitted.

Figure 8:
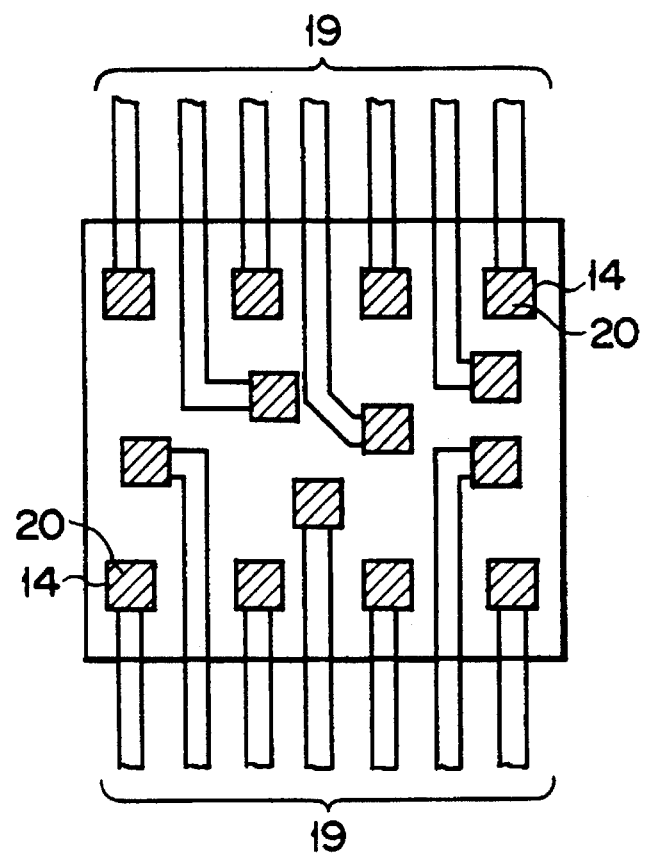

FIG. 8 shows a modification of the device using a semiconductor which is the so-called free access pad layout system wherein the electrode pads are arranged on the entire surface of the semiconductor chip at random.

As mentioned above, the present invention can be used in any type of chip regardless of the arrangement of the electrode pads on the chip.

Next, other embodiments of the present invention will be explained.

FIG. 9 shows the structure of the semiconductor device relating to a second embodiment of the present invention wherein the present invention is used in the connection between the outer leads of the lead frame and the wiring pattern on the print circuit board. In the drawing, reference numeral 11 is a semiconductor chip, and reference numeral 17 is a TAB tape. In this embodiment, the top end portion of the inner lead of the TAB tap and electrode pad (not shown) on the semiconductor chip 11 are electrically connected by a metal plating layer 20 similar to the first embodiment. According to the second embodiment, a wiring pattern 52, which is formed on a print circuit board 51, and the outer lead of the TAB tape are also electrically connected by the metal plating layer 20.

FIG. 10 shows the structure of the semiconductor device relating to a third embodiment of the present invention wherein the present invention is used in the connection between the outer leads of the lead frame and the wiring pattern on the print circuit board. According to the third embodiment, the lead frame is formed by punching a metal thin film, which is formed of alloy such as 4—2 alloy and copper by a press process. An inner lead 53 of the lead frame and an electrode pad 14 on a semiconductor chip are electrically connected by use of both a conductive adhesive 54 and a metal plating layer 55. In the case of the first embodiment using the TAB tape, the metal plating layer can be formed in a manner that the semiconductor chip is adhered to the TAB tape by the adhesive in advance. In the case of using the lead frame formed by punching the metal thin film, the adhesive 54 is formed on each electrode pad 14 in advance by a screen printing method and the electrode pad 14 and the lead frame 53 are adhered by the adhesive 54. Thereafter, the plating layer 55 is formed by the same method as mentioned above, and both the electrode pad and the lead frame can be electrically connected.

As mentioned above, the present invention can be used in not only the connection between the inner lead of the lead frame and the electrode pad on the semiconductor chip but also the connection between the outer lead and the wiring pattern on the print circuit board, and the same effect can be obtained. Moreover, the present invention can be used in the electrical connection between a liquid crystal display and TAB tape.

The present invention is not limited to the above-mentioned embodiments. It is needless to say that the present invention can be variously modified. For example, in the above embodiments explained the case wherein the metal plating layer was the nickel plating layer. According to the present invention, Au plating layer and copper plating layer can be used in addition to the above case.

The above first embodiment explained the case wherein the most of the surface other than the top end portion of the inner lead was coated with the insulating film in advance. However, in the portion other than the top end portion of the inner lead, the thickness of which the plating layer can grow on the above portion is about only 1/10 times that of the top end portion when the electrolytic plating is performed, the adherence of the insulating film can be omitted.

Moreover, the method of the above embodiment explained the case that the plating layer was formed by the electrolytic plating method. However, the plating layer can be formed by an electrolessly plating method.

FIG. 11 is a cross sectional view showing a device of a fourth embodiment of the present invention. The above embodiments explained the case in which two wirings are connected to each other by the plating metal. However, this plating metal can be used as a sealing for the semiconductor device. The device of the fourth embodiment shows that the plating layer is used as a sealing for a cap of a PGA (Pin Grid Array) typed semiconductor device. In FIG. 11, a package 61 is formed by layering tow ceramic plates 62 and 63. On one ceramic plate 62, a concave portion 64 is formed, and a semiconductor chip 65 is contained in the concave portion 64. Also, a plurality of wirings 66, 66, . . . are formed on the surface of one ceramic plate 62. Moreover, there are formed a plurality of pads (not shown) on the surface of the semiconductor chip 65. Then, the plurality of pads on the semiconductor chip 65 and the plurality of wirings 66, 66 . . . are connected by metal wires 67, 67 . . . , respectively.

On the other ceramic plate 63, there is formed an opening 68 having an area larger than the concave portion 64 at the position corresponding to the concave portion 64 of one ceramic plate 62. The opening 68 forms the concave portion 64 and the containing section of the semiconductor chip 68. Then, on the surface of the ceramic plate 63 around the opening 68, there is formed, for example, an Fe—Ni metal layer 69. Moreover, the opening 68 of the ceramic plate 63 is covered with a cap 70. The metal layer 69 and the cap 70 are adhered to each other by a metal plating layer 71 formed of nickel. The metal plating layer 71 is also formed between the cap 70 and the metal layer 69 and on the entire exposed surface.

As mentioned above, the metal plating layer can be used as a sealing for the cap.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device using a lead frame comprising the steps of:
   preparing a semiconductor chip having at least one pad on a surface thereof;
   preparing a lead frame coated with an insulating film and having at least one electrode pattern, said electrode pattern being formed on the insulating film and having an end face;
   adhering said lead frame to said semiconductor chip by use of an adhesive so that the pad on the semiconductor chip and the end face of the electrode pattern are positioned close to each other; and
   immersing said lead frame and said semiconductor chip in an electrolytic plating bath, thereby forming a metal layer which electrically connects the pad on the semiconductor chip to the end face of the electrode pattern.

2. A method according to claim 1, wherein said semiconductor chip has a plurality of pads on the surface, said lead frame has a plurality of electrode patterns, each of which is electrically connected to a common electrode, and an electric potential is supplied to said common electrode when the metal layer is formed.

3. A method according to claim 1, wherein said pad includes three metal layers made up of first, second and third layers, the first layer being a bottom layer made of aluminum, the second layer being a middle layer made of titanium, and the third layer being a top layer made of nickel.

4. A method according to claim 1, wherein said electrode pattern is formed of copper.

5. A method according to claim 1, wherein said electrolytic plating bath is a watt bath which contains nickel sulfate and nickel chloride.

6. A method according to claim 2, wherein a potential difference is provided between the common electrode and plating electrode in the process of forming said metal layer, such that the common electrode serves as a positive terminal and the plating electrode serves as a negative terminal.

7. A method according to claim 6, wherein a voltage of 2 V is applied between the common electrode and the plating electrode, and a current of 60 mA is made to flow between the common and plating electrodes for 10 minutes in the process of forming said metal layer.

8. A method of manufacturing a semiconductor device using a lead frame comprising the steps of:
   preparing a semiconductor chip having at least one pad on a surface thereof;
   preparing a lead frame coated with an insulating film and having at least one electrode pattern which is formed on the insulating film and which is comprised of an inner lead and an outer lead, said inner lead having an end surface at a distal end thereof, said inner and outer leads of the electrode pattern being coated with an insulating film, except the distal end of the inner lead;
   adhering said lead frame to said semiconductor chip by use of an adhesive so that the pad on the semiconductor chip and the end face of the distal end of the inner lead are positioned close to each other; and
   immersing said lead frame and said semiconductor chip in an electrolytic plating bath, thereby forming a metal layer which electrically connects the pad on the semiconductor chip to the end face of the top end portion of the inner lead.

9. A method according to claim 8, wherein said insulating film is an epoxy insulating film.

10. A method according to claim 8, wherein said semiconductor chip has a plurality of pads on the surface, said lead frame has a plurality of electrode patterns, each of which is electrically connected to a common electrode, and an electric potential is supplied to said common electrode when the metal layer is formed.

11. A method according to claim 8, wherein said pad includes three metal layers made up of first, second and third layers, the first layer being a bottom layer made of aluminum, the second layer being a middle layer made of titanium, and the third layer being a top layer made of nickel.

12. A method according to claim 8, wherein said electrode pattern is formed of copper.

13. A method according to claim 8, wherein said electrolytic plating bath is a watt bath which contains nickel sulfate and nickel chloride.

14. A method according to claim 10, wherein a potential difference is provided between the common electrode and a plating electrode in the process of forming said metal layer, such that the common electrode serves as a positive terminal and the plating electrode serves as a negative terminal.

15. A method according to claim 14, wherein a voltage of 2 V is applied between the common electrode and the plating electrode, and a current of 60 mA is made to flow between the common and plating electrodes for 10 minutes in the process of forming said metal layer.

* * * * *